(12) United States Patent
Ryu et al.

(10) Patent No.: US 9,755,054 B2
(45) Date of Patent: Sep. 5, 2017

(54) THIN FILM TRANSISTOR AND METHOD OF MANUFACTURING THE SAME

(71) Applicant: Samsung Display Co., Ltd., Yongin-si, Gyeonggi-do (KR)

(72) Inventors: Myung Kwan Ryu, Yongin-si (KR); Ki Hwan Kim, Hwaseong-si (KR); Kap Soo Yoon, Cheonan-si (KR); Hyeon Jun Lee, Hwaseong-si (KR); Jeong Uk Heo, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/956,056

(22) Filed: Dec. 1, 2015

(65) Prior Publication Data

US 2016/0218197 A1 Jul. 28, 2016

(30) Foreign Application Priority Data

Jan. 26, 2015 (KR) .................. 10-2015-0012375

(51) Int. Cl.

| | |
|---|---|
| *H01L 29/66* | (2006.01) |
| *H01L 29/417* | (2006.01) |
| *H01L 29/786* | (2006.01) |
| *H01L 29/423* | (2006.01) |
| *H01L 21/306* | (2006.01) |
| *H01L 21/324* | (2006.01) |

(52) U.S. Cl.
CPC ...... *H01L 29/66742* (2013.01); *H01L 21/324* (2013.01); *H01L 29/42384* (2013.01); *H01L 29/7869* (2013.01); *H01L 29/78621* (2013.01); *H01L 29/78681* (2013.01); *H01L 29/78684* (2013.01)

(58) Field of Classification Search
None
See application file for complete search history.

(56) References Cited

U.S. PATENT DOCUMENTS

| | | | |
|---|---|---|---|
| 8,530,273 B2 | 9/2013 | Den Boer | |
| 8,624,240 B2 | 1/2014 | Sato et al. | |
| 2009/0283763 A1* | 11/2009 | Park | H01L 29/78621 257/43 |
| 2009/0294772 A1* | 12/2009 | Jeong | H01L 27/1225 257/59 |

FOREIGN PATENT DOCUMENTS

KR    10-0462508    12/2004

\* cited by examiner

*Primary Examiner* — Whitney T Moore
(74) *Attorney, Agent, or Firm* — Robert E. Bushnell, Esq.

(57) ABSTRACT

There are provided a method of manufacturing a thin film transistor and a display including a thin film transistor.

The method of manufacturing a thin film transistor includes forming a barrier layer cm a substrate, forming a semiconductor layer on the barrier layer, forming a gate insulating layer on the semiconductor layer, forming a gate electrode on the gate insulating layer, forming an offset region on an external surface of the gate electrode through a plasma heat treatment process or an annealing process, etching, an offset region of the gate electrode, etching a gate insulating layer except for a portion of the gate insulating layer, positioned below the gate electrode, forming an interlayer insulating layer on the gate electrode, and etching, the interlayer insulating layer to form a source electrode and a drain electrode.

8 Claims, 26 Drawing Sheets

THIN FILM TRANSISTOR AND METHOD OF MANUFACTURING THE SAME

CLAIM OF PRIORITY

This application claims the priority to and all the benefits accruing under 35 U.S.C. §119 of Korean Patent Application No. 10-2015-0012375 filed in the Korean Intellectual Property Office (KIPO) on Jan. 26, 2015, the entire contents of which are incorporated herein by reference.

BACKGROUND OF THE INVENTION

Field of Disclosure

The present invention relates to a thin film transistor and a method of manufacturing the same.

Description of the Related Art

A thin film transistor (TFT) has been used as various electronic devices such as flat panel displays and so on. For example, a thin film transistor ha been used as a switching element or a driving element in a flat panel display such as a liquid crystal display (LCD), an organic light emitting diode (OLED) display, an electrophoretic display, and so on.

A thin film transistor includes a gate electrode connected to a gate line for transmission of a scanning signal, a source electrode connected to a data line for transmission of a signal to be applied to a pixel electrode, a drain electrode facing the source electrode, and a semiconductor that is electrically connected to the source electrode and the drain electrode.

The semiconductor of the thin film transistor is formed of amorphous silicon, crystalline silicon, or the like. Amorphous silicon may be deposited at low temperature to form a thin film and is mainly used in a display device using a substrate that is mainly formed of glass with low melting point, and crystalline silicon has electrical properties of high electric field effect mobility, high frequency operating characteristic, and low leakage current.

However, an amorphous silicon thin film with a bottom gate structure, has difficulty in forming a large-area display device due to its low electric field effect mobility and so on.

To overcome this, a thin film transistor with a top gate structure, to which a low temperature polycrystalline silicon thin film with excellent carrier mobility is applied, is used. However, a transistor using a low temperature crystalline silicon thin film has complex manufacturing process, and as an organic light emitting display including a low temperature crystalline silicon thin film is further large-scaled, productivity is largely degraded.

Accordingly, research has been continuously conducted into a thin film transistor with a top gate structure for minimizing a channel of a low oxide semiconductor with low carrier mobility to embody a large-area display device.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method of manufacturing a thin film transistor having advantages of minimizing the length of a channel formed on a semiconductor layer between a source electrode and a drain electrode through a thin film transistor with a top gate structure including an oxide semiconductor layer.

The present invention has been made in an effort to provide a method of manufacturing a thin film transistor having advantages of minimizing a channel length to embody a large-area display device through a conventional process.

An exemplary embodiment of the present invention provides a method of manufacturing a thin film transistor, including forming a barrier layer on a substrate, forming a semiconductor layer on the barrier layer, forming a gate insulating layer on the semiconductor layer, forming a gate electrode on the gate insulating layer, forming an offset region on an external surface of the gate electrode through a plasma heat treatment process or an annealing process, etching an offset region of the gate electrode, etching a gate insulating layer except for a portion of the gate insulating layer, positioned below the gate electrode, forming an interlayer insulating layer on the gate electrode, and etching the interlayer insulating layer to form a source electrode and a drain electrode.

The method may further include surface-treating an upper portion of the semiconductor layer to form an ohmic contact layer.

Surface treatment may be performed through a plasma treatment process or a light illumination process.

The semiconductor layer may be formed of an oxide semiconductor, amorphous silicon, chalcogenide, or graphene.

Another embodiment of the present invention provides a method of manufacturing a thin film transistor, including forming a barrier layer on a substrate, forming a semiconductor layer on the barrier layer, forming a source electrode and a drain electrode on the barrier layer, forming an offset layer on the source electrode, the drain electrode, and the barrier layer, etching the offset layer formed between the source electrode and the drain electrode, forming a gate insulating layer on the offset layer and the semiconductor layer, and forming a gate electrode on the gate insulating layer.

The method may further include removing an ohmic contact layer on the semiconductor layer.

The ohmic contact layer may be formed any one of indium tin oxide (ITO) or gallium-doped zinc oxide (GZO).

The method may further include removing the offset layer formed between the source electrode and the drain electrode and then etching the ohmic contact layer formed between on the offset layer and the source electrode and the drain electrode.

The semiconductor layer may be formed of any one of an oxide semiconductor, amorphous silicon, chalcogenide, or graphene.

The offset layer may be formed of any one of metal oxide, zinc oxynitride, organic material, or spin on glass (SOG).

Yet another embodiment of the present invention provides a thin film transistor including a substrate, a barrier laser positioned on the substrate, a semiconductor layer positioned on the barrier layer, a gate electrode positioned on the semiconductor layer and formed by forming an offset region through a plasma heat treatment process or an annealing process and then etching the offset region through an etching process, a gate insulating layer positioned between the semiconductor layer and the gate electrode, a source electrode and a drain electrode, positioned on the semiconductor layer, and an interlayer insulating layer positioned between the source electrode and the drain electrode, and the semiconductor layer and the gate electrode.

The thin film transistor may further include an ohmic contact layer positioned on the semiconductor layer.

The ohmic contact layer may be formed by surface-treating the semiconductor layer through a plasma treatment process or a light illumination process.

The semiconductor layer may be formed of an oxide semiconductor, amorphous silicon, chalcogenide, or graphene.

Yet another embodiment of the present invention provides a thin film transistor including a substrate, a barrier layer positioned on the substrate, a semiconductor layer positioned on the barrier layer, a source electrode and a drain electrode, positioned to be spaced apart from each other by a predetermined distance on the semiconductor layer, an offset layer positioned on the source electrode and the drain electrode, a gate insulating layer positioned on the offset layer and the semiconductor layer, and a gate electrode positioned on the gate insulating layer.

The offset layer may be formed of any one of metal oxide, zinc oxynitride, organic material, or spin on glass (SOG).

The semiconductor layer may be formed of any one of an oxide semiconductor, amorphous silicon, chalcogenide, or graphene.

The thin film transistor may further include an ohmic contact layer positioned on the semiconductor layer.

The ohmic contact layer may be formed of any one of indium tin oxide (ITO) or gallium-doped zinc oxide (GZO).

The ohmic contact layer may be positioned only below the source electrode and the drain electrode.

According to an embodiment of the present invention, the method of manufacturing a thin film transistor may minimize a length of a channel formed on a semiconductor layer between a source electrode and a drain electrode so as to ensure high current driving capability.

Since the same driving current may be obtained by a relatively low voltage as a channel length is minimized, influence due to voltage stress is minimized, thereby improving the reliability of the thin film transistor.

A thin film transistor with minimized channel length may be embodied through a conventional exposure equipment so as to achieve a large-area display device.

In addition, a length of a channel between a source electrode and a drain electrode is reduced to increase an overall aperture ratio of a display device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
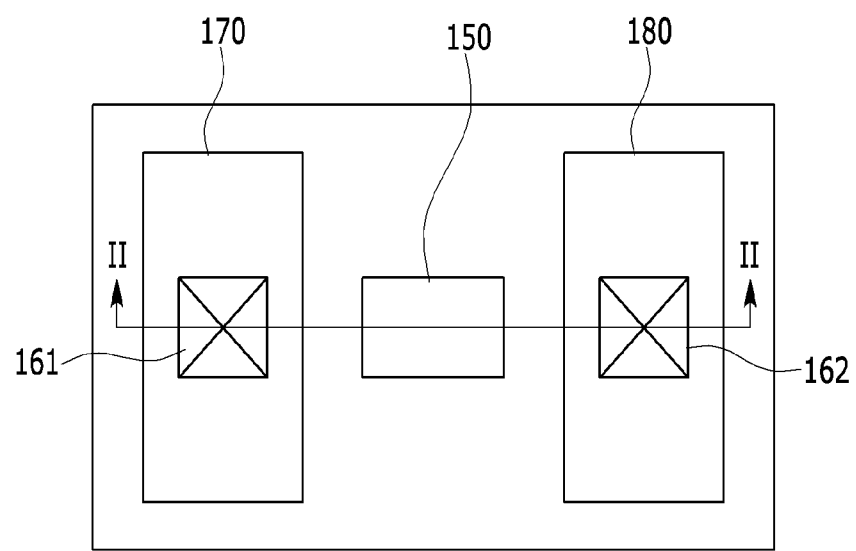
FIG. 1 is a layout view illustrating a thin film transistor according to first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the present invention, a part without concerning to the description is omitted in the drawings, and like reference numerals in the specification denote like elements.

Sizes and thicknesses of components are arbitrarily shown for convenience of description, and thus the present invention is not limited to the drawings. The thicknesses are expanded in the drawings for clarity of parts and regions.

In the drawings, the thicknesses of layers and regions, etc., are exaggerated for clarity. In the drawings, thicknesses of some layers and regions are exaggerated for convenience of description. It will be understood that when an element such as a layer, film, region, or substrate is referred to as being "on" another element, it can be directly on the other element or intervening elements may also be present.

Hereinafter, a structure of a thin film transistor according to an exemplary embodiment of the present invention will be described in detail with reference to the attached drawings.

Figure 2:
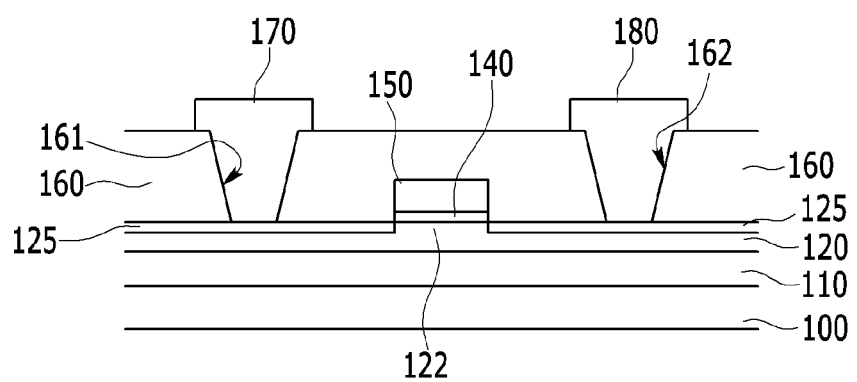
FIG. 2 is a cross-sectional view taken along line II-II of FIG. 1.

FIG. 1 is a layout view illustrating a thin film transistor according to first exemplary embodiment of the present invention. FIG. 2 is a cross-sectional view taken along line II-II of FIG. 1.

As shown in FIG. 1 and FIG. 2, the thin film transistor according to an exemplary embodiment of the present invention is a top gate-type thin film transistor in which a gate electrode is disposed on a semiconductor layer, and includes a barrier layer 110, a semiconductor layer 120, a gate insulating layer 140, a gate electrode 150, an interlayer insulating layer 160, a source electrode 170, and a drain electrode 180 that are sequentially formed on a substrate 100.

In detail, the barrier layer 110 is positioned on the substrate 100, the semiconductor layer 120 is positioned on the barrier layer 110, the gate electrode 150 is positioned on the semiconductor layer 120, the gate insulating layer 140 is positioned between the semiconductor layer 120 and the gate electrode 150, the source electrode 170 and the drain electrode 180 are positioned on the semiconductor layer 120, and an interlayer insulating layer 160 is positioned between the source electrode 170 and the drain electrode 180, and the semiconductor layer 120 and the gate electrode 150.

The gate electrode 150 is formed by forming an offset region via a plasma heat treatment process or an annealing process and then etching the offset region via an etching process. A detailed manufacturing method will be described later.

An ohmic contact layer 125 may further disposed on the semiconductor layer 120.

The substrate 100 may be formed of glass, a high molecular material, silicon wafer, or the like and the gate electrode 150 may be connected to a gate line (not shown) formed in one direction of the substrate 100. The source electrode 170 and the drain electrode 180 that are electrically connected to the semiconductor layer 120 when a voltage is applied to the source electrode 170 and the drain electrode 180 are formed at opposite sides of the gate electrode 150.

The source electrode 170 and the drain electrode 180 are electrically connected to the semiconductor layer 120 through a first contact hole 161 and a second contact hole 162, respectively.

The gate electrode 150, the source electrode 170, and the drain electrode 180 constitute a thin film transistor, and a channel 122 of the thin film transistor is formed below the gate electrode 150.

The semiconductor layer 120 may be formed of an oxide semiconductor, amorphous silicon, organic material, chalcogenide, or graphene.

Figure 3:
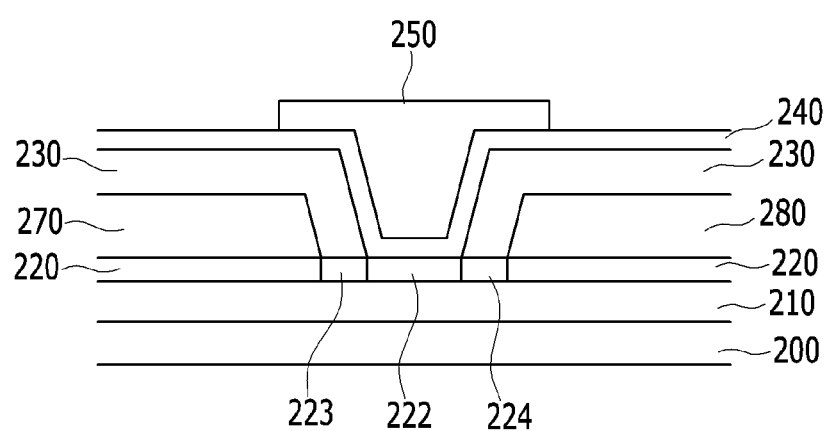
FIG. 3 is a cross-sectional view illustrating a thin film transistor according to second exemplary embodiment of the present invention

FIG. 3 is a cross-sectional view illustrating a thin film transistor according to another exemplary embodiment of the present invention.

As shown in FIG. 3, the thin film transistor according to another exemplary embodiment of the present invention is a top gate type thin film transistor in which a gate electrode is disposed on a semiconductor layer, and includes a barrier layer 210, a semiconductor layer 220, a source electrode 270, a drain electrode 280, an offset layer 230, a gate insulating layer 240, and a gate electrode 250 that are sequentially formed on a substrate 200.

In detail, the barrier layer 210 is positioned on the substrate 200, the semiconductor layer 220 is positioned on the barrier layer 210, the source electrode 270 and the drain electrode 280 are positioned to be spaced apart from each other by a predetermined distance on the semiconductor layer 220, the offset layer 230 is positioned on the source electrode 270 and the drain electrode 280, the gate insulating layer 240 is positioned on the offset layer 230 and the semiconductor layer 220, and a gate electrode 250 is positioned on the gate insulating layer 240.

In this case, an ohmic contact layer 225 may be formed between the semiconductor layer 220 and the source electrode 270/the drain electrode 280. The ohmic contact layer 225 reduces contact resistance between the source electrode 270/the drain electrode 280 and the semiconductor layer 220. The ohmic contact layer 225 may be omitted according to a type of the substrate 200 or a processing condition.

The ohmic contact layer 225 may be positioned only below the source electrode 270 and the drain electrode 280. That is, a portion of the ohmic contact layer 225, which is positioned below the gate electrode 250, may be removed via an etching process. A detailed method will be described below.

The substrate 200 may be formed of glass, a high molecular material, silicon wafer, or the like and the gate electrode 250 may be connected to a gate line (not shown) formed in one direction of the substrate 200. The source electrode 270 and the drain electrode 280 that are electrically connected to the semiconductor layer 220 when a voltage is applied to the source electrode 270 and the drain electrode 280 are formed at opposite sides of the gate electrode 250.

The gate electrode 250, the source electrode 270, and the drain electrode 280 constitute a thin film transistor, and a channel 222 is formed between the source electrode 270 and the drain electrode 280.

Lightly doped source and drain regions 223 and 224 are positioned between the channel 222 and portions of semiconductor 220 contacting the source electrode 270 and the drain electrode 280.

Hereinafter, a method of manufacturing the aforementioned top gate-type thin film transistor will be described in detail with reference to the attached drawings.

FIGS. 4A to 4E are process flowcharts of a method of manufacturing a thin film transistor according to a first exemplary embodiment of the present invention.

Figure 4A:
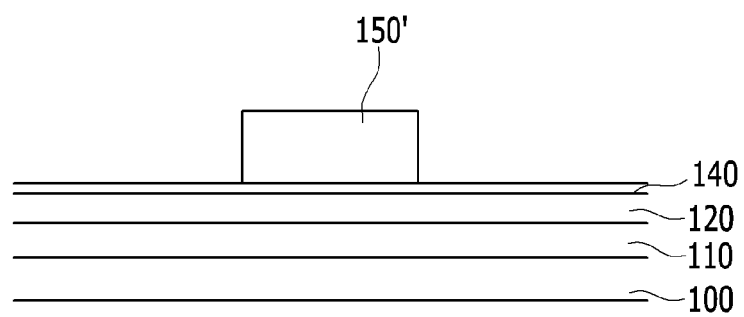
FIGS. 4A to 4E are process flowcharts of a method of manufacturing a thin film transistor according to the first exemplary embodiment of the present invention.

As shown in FIG. 4A, the barrier layer 110 is formed on the substrate 100. The barrier layer 110 may also be referred to as a blocking layer or a buffer layer. The barrier layer 110 may include silicon nitride (SiNx), silicon oxide (SiOx), silicon oxynitride (SiOxNy), or the like, and may be formed as a single layer or a multi-layer. The barrier layer 110 may be omitted according to a type of the substrate 100 or a processing condition.

The semiconductor layer 120 is formed on the barrier layer 110. The semiconductor layer 120 may be formed of an oxide semiconductor, amorphous silicon, organic material, chalcogenide, or graphene.

When the semiconductor layer 120 is formed of an oxide semiconductor, the oxide semiconductor may include any one of oxide using zinc (Zn), gallium (Ga), tin (Sn) or indium (In) as a basic material, and a compound oxide thereof such as zinc oxide (ZnO), indium-gallium-zinc oxide (InGaZnO4), indium-zinc oxide (Zn—In—O), or zinc-tin oxide (Zn—Sn—O).

The gate insulating layer 140 is formed on the semiconductor layer 120. The gate insulating layer 140 may include an insulating material such as silicon oxide (SiOx), silicon nitride (SiNx), or silicon oxynitride (SiON). The gate insulating layer 140 may be formed using a sputtering method or the like.

A gate electrode layer 150' is formed on the gate insulating layer 140. The gate electrode layer 150' may be formed as a single layer or a multi-layer formed of metal such as copper, aluminum, tungsten, and titanium or an alloy thereof.

Figure 4B:
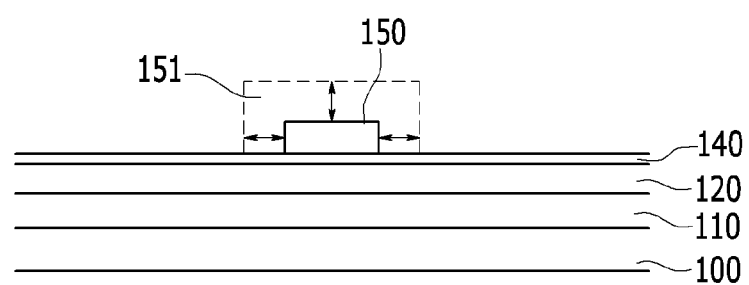
Figure 4C:
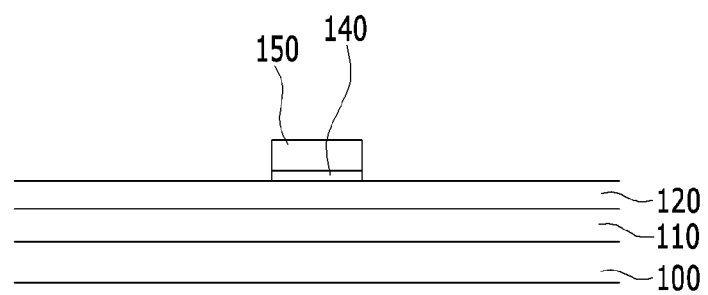

As shown in FIGS. 4B and 4C, an external surface of the gate electrode layer 150' and the gate insulating layer 140 may be oxidized through a plasma heat treatment process or an annealing process and then etched through a dry etching or photo-etching process. Here, an etched portion of the gate electrode layer 150' is referred to as an offset region 151. After etching, a gate electrode 150 remains from the gate electrode layer 150'.

In addition, a portion of the gate insulating layer 140 may be removed such that the gate insulating layer 140 is formed to cover the channel 122 formed on the semiconductor layer 120 below the gate electrode 150.

Figure 4D:
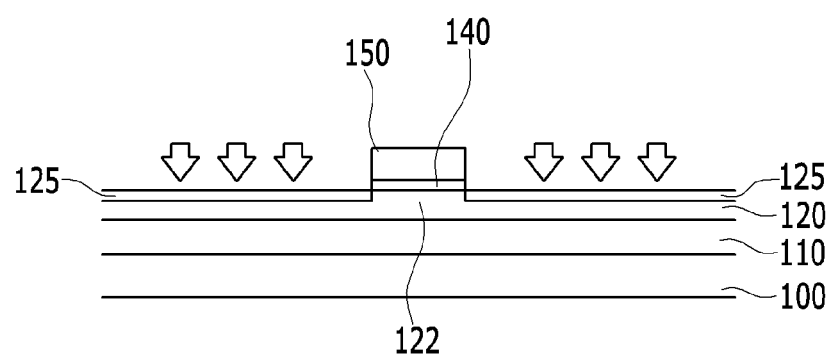

As shown in FIG. 4D, an upper portion of the semiconductor layer 120, which is exposed by removing the portion of the gate insulating layer 140, may be surface-treated to form the ohmic contact layer 125. In this case, the surface treatment may be performed through a plasma treatment process or a light illumination process. The ohmic contact layer 125 is disposed between the semiconductor layer 120, and the source electrode 170 and the drain electrode 180 so as to reduce contact resistance.

Figure 4E:
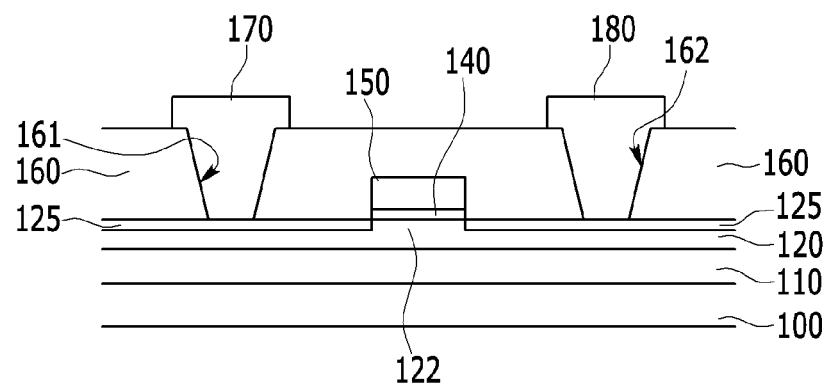

As shown in FIG. 4E, the interlayer insulating layer 160 is formed on the ohmic contact layer 125 and the gate electrode 150. The inorganic insulator or an organic insulator such as silicon nitride (SiNx), silicon oxide (SiOx), silicon nitroxide (SiOxNy), silicon oxide (SiOx), or the like.

In addition, the interlayer insulating layer 160 is etched though a dry etching or photo-etching process to form a first contact hole 161 and a second contact hole 162. And then, the source electrode 170 and the drain electrode 180 is formed on the interlayer insulating layer 160 and electrically connected to the semiconductor layer 120 through the first contact hole 161 and the second contact hole 162, respectively. In this case, the source electrode 170 and the drain electrode 180 may be a multi-layered thin film including the ohmic contact layer 125.

The source electrode 170 and the drain electrode 180 are disposed to face each other across the gate electrode 150.

In the aforementioned method of manufacturing the thin film transistor according to the first exemplary embodiment of the present invention, the gate electrode layer 150' may be formed and then the offset region 151 of the gate electrode layer 150' may be removed so as to minimize the length of the channel 122 formed below the gate electrode 150.

For example, the width of the gate electrode layer 150' formed through a general masking process may be about 2 mm and the thickness of the gate electrode layer 150' may be about 1 mm. Accordingly, the length of the channel 122 formed below the gate electrode layer 150' may be about 2 mm through only a conventional masking process.

However, when right and left widths, which each correspond to about 0.5 mm, of the offset region 151 of the gate electrode layer 150' are etched to be removed, the channel 122 formed below the gate electrode 150 may be formed with a length of about 1 mm.

As such, when the length of the channel 122 is reduced, carrier mobility between the source electrode 170 and the drain electrode 180 may be improved and channel resistance may be reduced. That is, even if the semiconductor layer 120 is formed of a material such as an oxide semiconductor, carrier mobility may be improved to a level corresponding to a low temperature crystalline silicon thin film transistor (PTPS TFT).

Hereinafter, a method of manufacturing a thin film transistor according to a second exemplary embodiment of the present invention will be described in detail with reference to the attached drawings.

FIGS. 5A to 5F are process flowcharts illustrating a method of manufacturing a thin film transistor according to a second exemplary embodiment of the present invention.

Figure 5A:
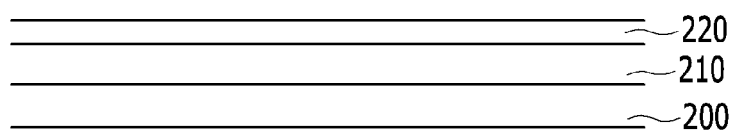
FIGS. 5A to 5F are process flowcharts illustrating a method of manufacturing a thin film transistor according to the second exemplary embodiment of the present invention.

As shown in FIG. 5A, the barrier layer 210 is formed on the substrate 200. The barrier layer 210 may be formed as the barrier layer 210 described with regard to the aforementioned first exemplary embodiment.

The semiconductor layer 220 is formed on the barrier layer 210. The semiconductor layer 220 may be formed as the semiconductor layer 220 described with regard to the aforementioned first exemplary embodiment.

Figure 5B:
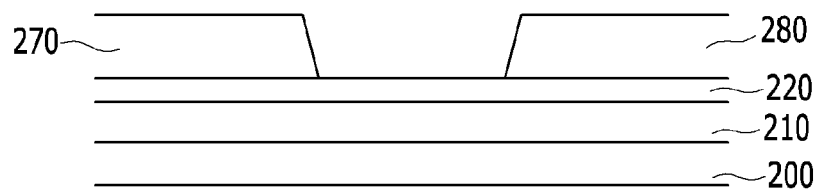

As shown in FIG. 5B, the source electrode 270 and the drain electrode 280 are formed on the semiconductor layer 220. The source electrode 270 and the drain electrode 280 are disposed to face each other across the gate electrode 250.

Figure 5C:
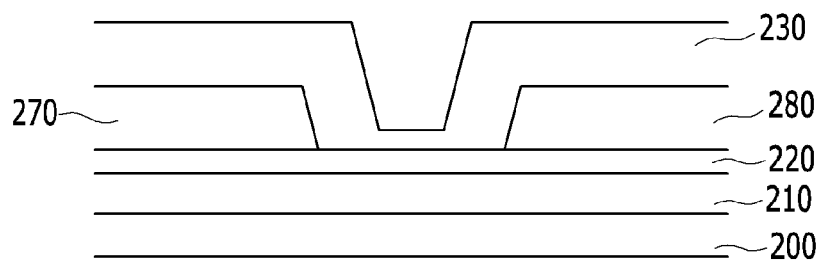

As shown in FIG. 5C, the offset layer 230 is formed on the source electrode 270, the drain electrode 280, and the semiconductor layer 220. The offset layer 230 may be formed of any one of metal oxide, zinc oxynitride, organic material, or spin on glass (SOG).

Figure 5D:
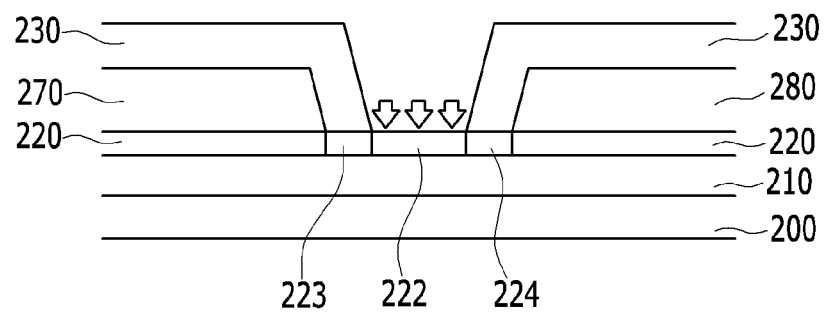

As shown in FIG. 5D, the offset layer 230 formed between the source electrode 270 and the drain electrode 280 is etched through an etching process. In this case, when the offset layer 230 is etched using etchant with a high selection ratio, only the offset layer 230 formed between the source electrode 270 and the drain electrode 280 may be selectively etched.

A portion of the semiconductor laser 220, which is exposed through an etching process, is surface-treated through a plasma process or a heat treatment process so as to control conductivity of the semiconductor layer 220. In this case, portions of lateral surfaces of the source electrode 270 and the drain electrode 280 become an insulating layer (an oxide layer or a nitride layer according to a treatment condition), and the semiconductor layer 220, which corresponds to the source electrode 270 and the drain electrode 280 that become an insulating layer, correspond to a lightly doped drain region (hereinafter, referred to as a 'LDD region').

The conductivity values of the LDD regions 223 and 224 are about an intermediate value of conductivity value of a region that contacts the source electrode 270 and the drain electrode 280 and conductivity value of a region of the channel 222. For example, the conductivity values of the source and drain electrodes 270 and 280 are higher than the LDD regions 223 and 224, and the conductivity values of the LDD regions 223 and 224 are higher than the channel region 222. The LDD region 223 and 224 prevents leakage current or punch through of a thin film transistor and prevents the characteristic or reliability of the semiconductor layer 220 from being degraded.

A short channel effect (such as drain-induced barrier lowering and punch through, surface scattering, velocity saturation, impact ionization, or hot electron effect, etc.) may occur as the length of the channel 222 is reduced. According to the drain-induced barrier lowering (DIBL) characteristic generated as one of short channel effects, a potential barrier of the channel 222 of the thin film transistor is lowered by a voltage applied to the drain electrode 280. Accordingly, even if a voltage difference between opposite ends of the gate electrode 250 and the source electrode 270 is not high, leakage current may flow between the drain electrode 280 and the source electrode 270. However, the DIBL characteristic generated due to the short channel effect may be suppressed by virtue of the LDD regions 223 and 224.

Figure 5E:
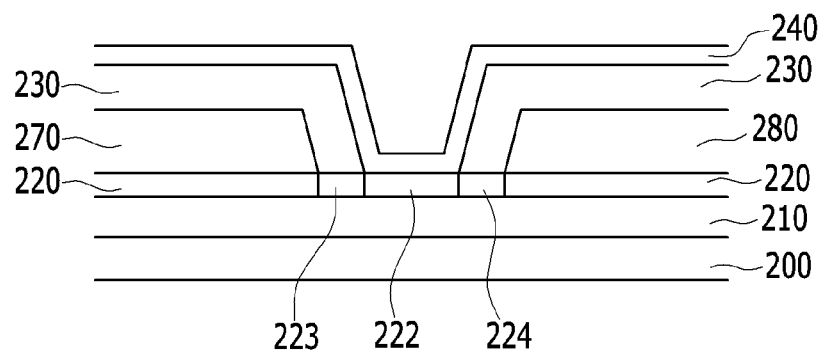

As shown in FIG. 5E, the gate insulating layer 240 is formed on the offset layer 230 and the exposed portion of the semiconductor layer 220. The gate insulating layer 240 may be formed as the gate insulating layer 240 described with regard to the aforementioned first exemplary embodiment.

Figure 5F:
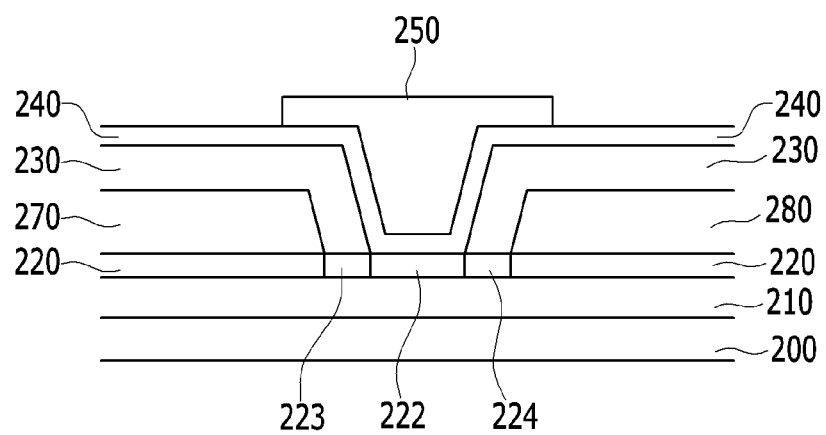

As shown in FIG. 5F, the gate electrode 250 is formed on the gate insulating layer 240. The gate electrode 250 may be formed as a single layer or a multi-layer formed of metal such as copper, aluminum, tungsten, and titanium or an alloy thereof.

In the aforementioned method of manufacturing the thin film transistor according to the second exemplary embodiment of the present invention, the offset layer 230 may be formed on the source electrode 270 and the drain electrode 280 and then the gate insulating layer 240 and the gate electrode 250 may be formed so as to minimize the length of the channel 222 formed below the gate electrode 250.

For example, a distance between the source electrode 270 and the drain electrode 280 that are formed through a general masking process may be about 2 um. In addition, when the thickness of the offset layer 230 is formed with about 0.5 um, the channel 222 may be formed with a length of about 1 um.

Hereinafter, a method of manufacturing a thin film transistor according to a third exemplary embodiment of the present invention will be described in detail with reference to the attached drawings.

FIGS. 6A to 6F are process flowcharts illustrating a method of manufacturing a thin film transistor according to a third exemplary embodiment of the present invention.

Referring to FIGS. 6A to 6F, the manufacturing method of the thin film transistor according to the third exemplary embodiment of the present invention is performed using the same process as the aforementioned second exemplary embodiment, except that the ohmic contact layer 225 is formed on the semiconductor layer 220. The same reference component as in the second exemplary embodiment uses the same reference numeral.

Figure 6A:
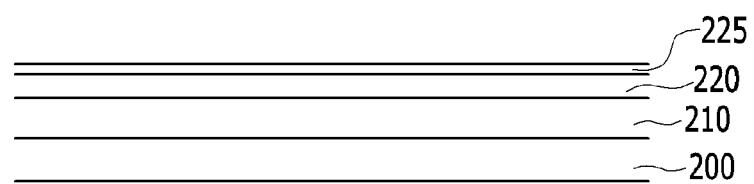
FIGS. 6A to 6F are process flowcharts illustrating a method of manufacturing a thin film transistor according to a third exemplary embodiment of the present invention.
Figure 6B:
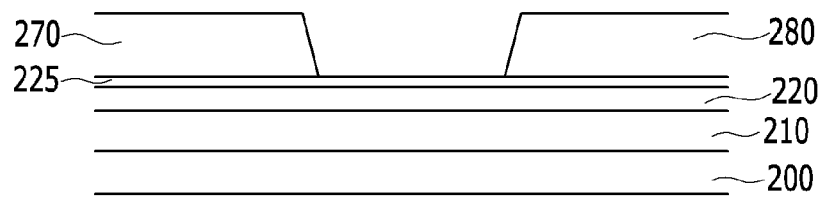
Figure 6C:
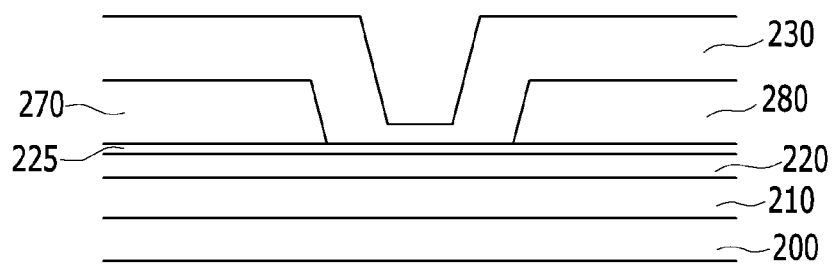
Figure 6D:
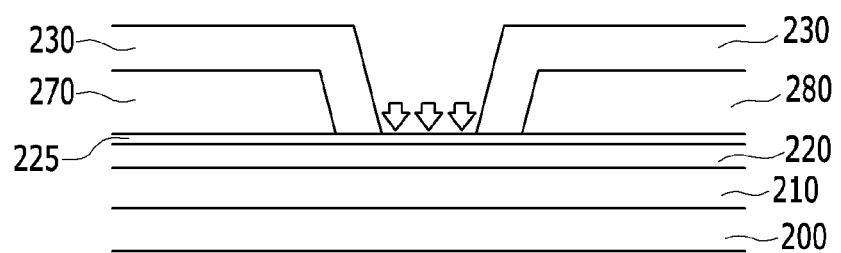
Figure 6E:
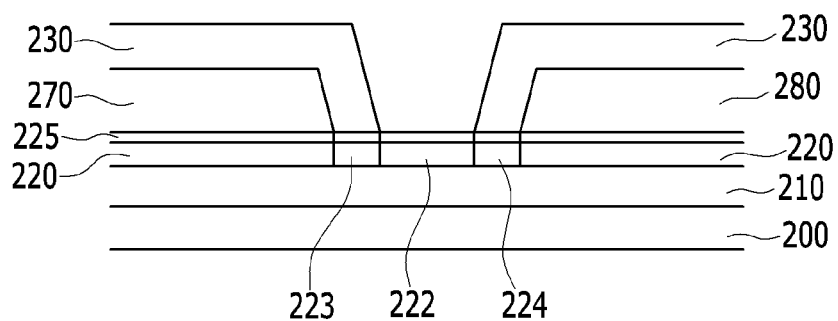

As shown in FIG. 6A, the barrier layer 210, the semiconductor layer 220, and the ohmic contact layer 225 are sequentially formed on the substrate 200. The barrier layer 210 and the semiconductor layer 220 may be formed as the barrier layer 210 and the semiconductor layer 220 that have been described with regard to the aforementioned first exemplary embodiment, respectively.

The ohmic contact layer 225 reduces contact resistance between the source electrode 270 and the semiconductor layer 220, and contact resistance between the drain electrode 280 and the semiconductor layer 220. The ohmic contact layer 225 may be formed of indium tin oxide (ITO), gallium-doped zinc oxide (GZO), or the like.

Processes illustrated in FIGS. 6B to 6F are the same as those of FIGS. 5B to 5F described with regard to the aforementioned second exemplary embodiment, and thus a detailed description thereof will be omitted here.

Hereinafter, a method of manufacturing a thin film transistor according to fourth exemplary embodiment of the present invention will be described in detail with reference to the attached drawings.

FIGS. 7A to 7F are process flowcharts illustrating a method of manufacturing a thin film transistor according to a fourth exemplary embodiment of the present invention.

Referring to FIGS. 7A to 7F, the manufacturing method of the thin film transistor according to the fourth exemplary embodiment of the present invention is performed using the same process as the aforementioned third exemplary embodiment, except that a portion of the ohmic contact layer 225, which corresponds to a region of the channel 222, is removed through an etching process. The same reference component as in the third exemplary embodiment uses the same reference numeral.

Processes illustrated in FIGS. 7A to 7D are the same as those of FIGS. 6A to 6D described with regard to the aforementioned third exemplary embodiment, and thus a detailed description thereof will be omitted here.

Figure 7A:
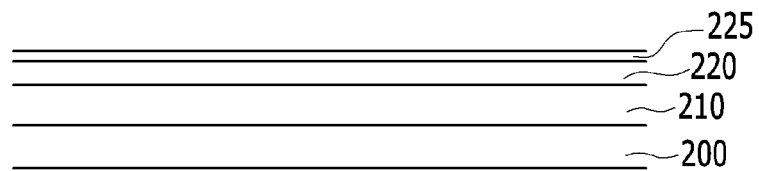
FIGS. 7A to 7F are process flowcharts illustrating a method of manufacturing a thin film transistor according to a fourth exemplary embodiment of the present invention.
Figure 7B:
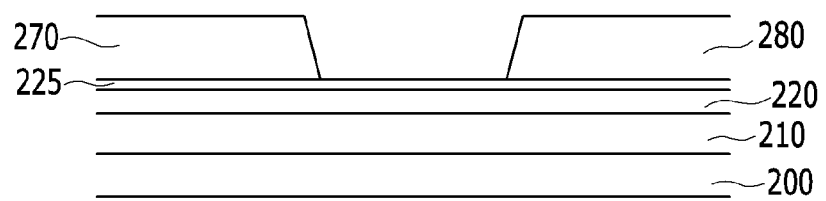
Figure 7C:
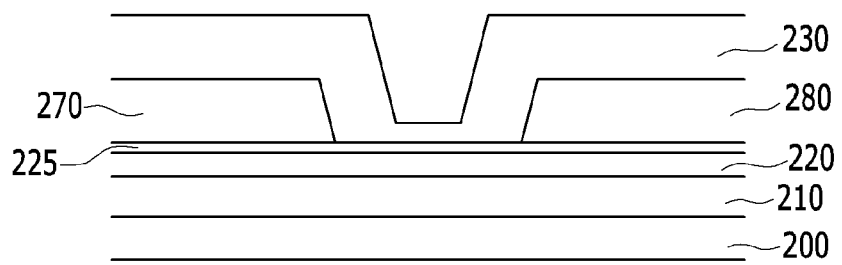
Figure 7D:
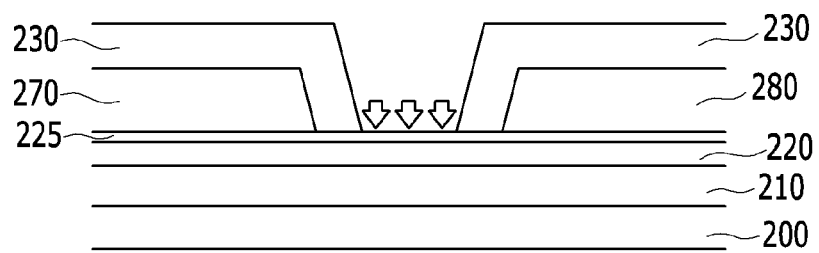
Figure 7E:
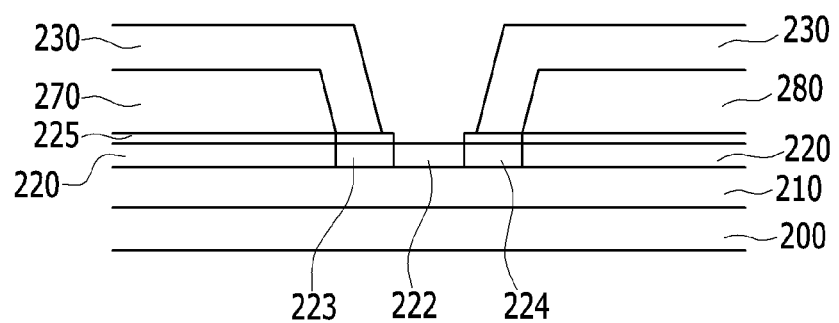

Then, as shown in FIG. 7E, a portion of the ohmic contact layer 225, which correspond to the region of the channel 222 of the semiconductor layer 220, is removed through an etching process. The portion of the ohmic contact layer 225 is removed in order to prevent the source electrode 270 and the drain electrode 280 from being short-circuited by the ohmic contact layer 225.

Figure 6F:
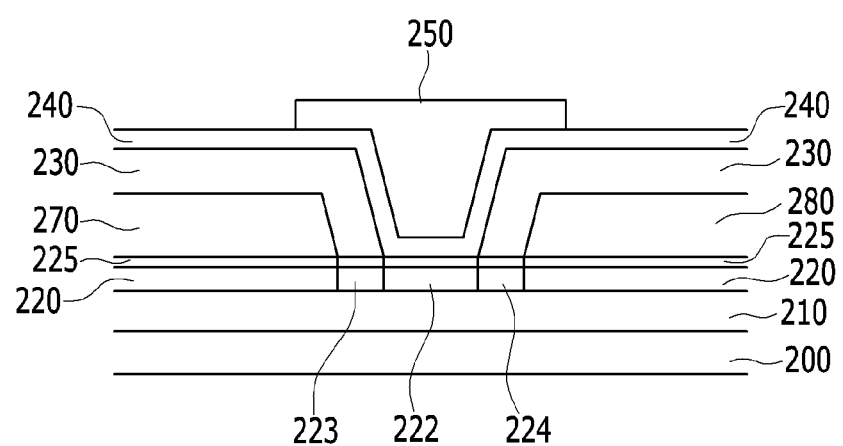
Figure 7F:
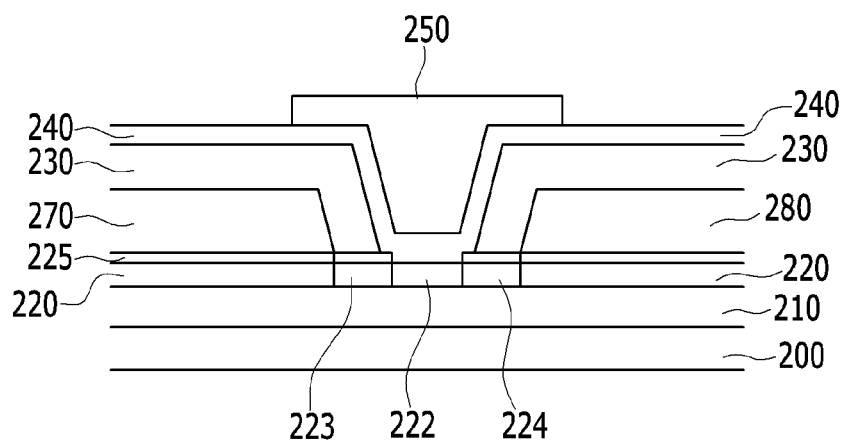

A process illustrated in FIG. 7F is the same as that of FIG. 6F described with regard to the aforementioned third exemplary embodiment, and thus a detailed description thereof will be omitted here.

As described above, the length of the channel 222 may be minimized through the offset region 151 according to the first exemplary embodiment of the present invention or the offset layer 230 according to the second to fourth exemplary embodiments. The length of the channel 222 may be minimized, and thus even if an oxide semiconductor is used, carrier mobility corresponding to a level of LTPS may be obtained, and channel resistance is reduced to obtain a large-area display device.

In addition, a channel length corresponding to a level of sub micro meter may be obtained without a high-resolution light exposer.

In addition, since the same driving current may be obtained by a relatively low voltage as a channel length is minimized, influence due to voltage stress is minimized, thereby improving the reliability of an operation of a thin film transistor.

Thus far, the exemplary embodiments of the present invention have been described, but the present invention is not limited to the exemplary embodiments and the exemplary variations. For example, although a liquid crystal display panel has been exemplified with regard to the present invention, the present invention is also applicable to a display panel of other display devices such as an organic light emitting display and so on. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

100, 200: substrate
110, 210: barrier layer
120, 220: semiconductor layer
122, 222: channel
223, 224: LDD region
125, 225: ohmic contact layer
140, 240: gate insulating layer
150, 250: gate electrode
151: offset region
160: interlayer insulating layer
170, 270: source electrode
180, 280: drain electrode
230: offset layer

What is claimed is:

1. A method of manufacturing a thin film transistor, the method comprising:
forming a barrier layer on a substrate;
forming a semiconductor layer on the barrier layer;
forming a gate insulating layer on the semiconductor layer;
forming a gate electrode layer on the gate insulating layer;
forming an offset region on an external surface of the gate electrode layer through one of a plasma heat treatment process and an annealing process;
etching the offset region to form a gate electrode;
etching the gate insulating layer except for a portion of the gate insulating layer positioned below the gate electrode;
forming an interlayer insulating layer on the gate electrode; and
etching the interlayer insulating layer to form a source electrode and a drain electrode.

2. The method of claim 1, further comprising surface-treating an upper portion of the semiconductor layer to form an ohmic contact layer.

3. The method of claim 2, wherein surface treatment is performed through one of a plasma treatment process and a light illumination process.

4. The method of claim 1, wherein the semiconductor layer is formed of one of an oxide semiconductor, amorphous silicon, chalcogenide, and graphene.

5. A thin film transistor comprising:
   a substrate;
   a barrier layer positioned on the substrate;
   a semiconductor layer positioned on the barrier layer;
   a gate electrode positioned on the semiconductor layer and formed by forming an offset region of a gate electrode layer through one of a plasma heat treatment process and an annealing process and then etching the offset region through an etching process;
   a gate insulating layer positioned between the semiconductor layer and the gate electrode;
   a source electrode and a drain electrode, positioned on the semiconductor layer; and
   an interlayer insulating layer positioned between the source electrode and the drain electrode, interlayer insulating layer being in direct contact with the semiconductor layer, the gate insulating layer and the gate electrode.

6. The thin film transistor of claim 5, further comprising an ohmic contact layer positioned on the semiconductor layer.

7. The thin film transistor of claim 5, wherein the ohmic contact layer is formed by surface-treating the semiconductor layer through one of a plasma treatment process and a light illumination process.

8. The thin film transistor of claim 5, wherein the semiconductor layer is formed of one of an oxide semiconductor, amorphous silicon, chalcogenide, and graphene.

* * * * *